US009847764B2

(12) United States Patent
Grenn et al.

(10) Patent No.: US 9,847,764 B2
(45) Date of Patent: Dec. 19, 2017

(54) GENERATING ADAPTIVE NOTIFICATION

(71) Applicant: BlackBerry Limited, Waterloo (CA)

(72) Inventors: John Patrick Grenn, Waterloo (CA); Nazih Almalki, Waterloo (CA); Bradley Ferringo, Marco Island, FL (US)

(73) Assignee: BlackBerry Limited, Waterloo, Ontario (CA)

(*) Notice: Subject to any disclaimer, the term of this patent is extended or adjusted under 35 U.S.C. 154(b) by 0 days.

(21) Appl. No.: 14/852,156

(22) Filed: Sep. 11, 2015

(65) Prior Publication Data

US 2017/0077885 A1    Mar. 16, 2017

(51) Int. Cl.
| H03G 3/20 | (2006.01) |
|---|---|
| H03G 3/30 | (2006.01) |
| H04M 1/725 | (2006.01) |
| H04M 19/04 | (2006.01) |
| G08B 3/10 | (2006.01) |
| G10L 25/18 | (2013.01) |
| G10L 25/48 | (2013.01) |

(52) U.S. Cl.
CPC ............. H03G 3/3005 (2013.01); G08B 3/10 (2013.01); G10L 25/18 (2013.01); G10L 25/48 (2013.01); H04M 1/72569 (2013.01); H04M 19/044 (2013.01); H04M 2250/12 (2013.01)

(58) Field of Classification Search
CPC .. H04R 3/02; H04R 25/356; H04R 2227/005; H04R 27/00; H04R 3/002; H04R 1/1083; H04R 29/00; H04R 1/1016; H04R 1/1041; H04R 2410/05; H04R 2420/07; H04R 2430/03; H04R 2460/15; H04R 29/001; H04R 29/008; H04R 2430/01

USPC ... 381/71.1, 71.6, 73.1, 106, 71.12, 57, 107, 381/317, 318, 58, 74

See application file for complete search history.

(56) References Cited

U.S. PATENT DOCUMENTS

| 5,844,983 | A | 12/1998 | Lilja | |
|---|---|---|---|---|
| 7,982,587 | B1* | 7/2011 | Thanhauser | G04C 21/16 340/309.16 |
| 2005/0008135 | A1 | 1/2005 | Bressler | |
| 2005/0113147 | A1 | 5/2005 | VanEpps, Jr. et al. | |
| 2005/0170828 | A1 | 8/2005 | Nakamura et al. | |
| 2007/0274552 | A1* | 11/2007 | Konchitsky | H04R 3/007 381/328 |
| 2008/0137873 | A1* | 6/2008 | Goldstein | H04R 1/1016 381/57 |

(Continued)

FOREIGN PATENT DOCUMENTS

EP    2608503    6/2013

OTHER PUBLICATIONS

Extended European Search Report issued in European Application No. 16188156.0 dated Jan. 12, 2017.

*Primary Examiner* — Akelaw Teshale
(74) *Attorney, Agent, or Firm* — Fish & Richardson P.C.

(57) ABSTRACT

A method for generating adaptive notifications include analyzing, at a user device, a spectrum of environmental noise. A portion of the spectrum for adaptive notification enhancement is selected based on the analyzing the spectrum of environmental noise. An adapted notification is generated at the user device by enhancing the selected portion of the spectrum. The adapted notification is transmitted at the user device.

20 Claims, 5 Drawing Sheets

(56) References Cited

U.S. PATENT DOCUMENTS

| | | | |
|---|---|---|---|
| 2009/0067290 A1* | 3/2009 | Londo | G01S 7/52004 367/89 |
| 2013/0005280 A1* | 1/2013 | Leung | G01S 7/023 455/90.1 |
| 2015/0332564 A1* | 11/2015 | Weinberg | G08B 6/00 340/407.1 |
| 2016/0275936 A1* | 9/2016 | Thorn | G10L 13/08 |

* cited by examiner

GENERATING ADAPTIVE NOTIFICATION

TECHNICAL FIELD

This disclosure relates to generating notifications for communication devices and, more specifically, to generating adaptive notifications.

BACKGROUND

In some cases, a user device may provide notification functionalities. A notification may be an audio output. For example, a user device may generate a sound when the user device receives an email or a text. The sound may notify the user that an email or a text is received.

DESCRIPTION OF DRAWINGS

Like reference numbers and designations in the various drawings indicate like elements.

DETAILED DESCRIPTION

The present disclosure is directed to generating adaptive notifications. In some cases, a user device may be positioned in a noisy environment. The environmental noise may be spread uniformly across the audio spectrum (shapeless), or concentrated in one or more narrow frequency bands (highly shaped). In some cases, a user may have difficulty hearing a notification over the noisy environment.

In some cases, volume of the notification may be boosted to overcome the environmental noise. However, in some cases, boosting the volumes of the notifications may not be efficient or effective. For example, the dominant frequencies of the notification and the noise may coincide. While boosting the volume of the notification increases the amplitude uniformly across the frequency region, the increased amplitude of the dominant frequency of the notification may not be able to overcome the power of the noise at the same frequency regions. Thus, the notification may not be recognizable by the user. Furthermore, if the high power portion of the noise has a narrow bandwidth, boosting the volume of the notification may cause the notification to play at an un-necessarily high volume and create a bad user experience.

In some cases, an adaptive notification may be generated by measuring and analyzing the spectrum of the environmental noise. A portion of the spectrum that corresponds to low noise power may be identified for enhancement. An adaptive notification may be generated by enhancing the identified portion. In some cases, the enhancement may be based on a context of the notification. FIGS. 1-5 and associated descriptions provide additional details of these implementations.

Generating the adaptive notification according to methods and systems described herein may provide one or more advantages. For example, by enhancing the portion of the spectrum corresponding to low noise power, the adaptive notification may provide a recognizable audio output over the environmental noise without significantly increasing the overall volume of the notification. This approach may create a better user experience and reduce power consumption of the user device. Furthermore, by associating the enhancement with a context of the notification, the user may recognize the context of the notification based on the audio output of the notification, without looking at the device. Other advantages will be apparent to those of ordinary skill in the art.

Figure 1:
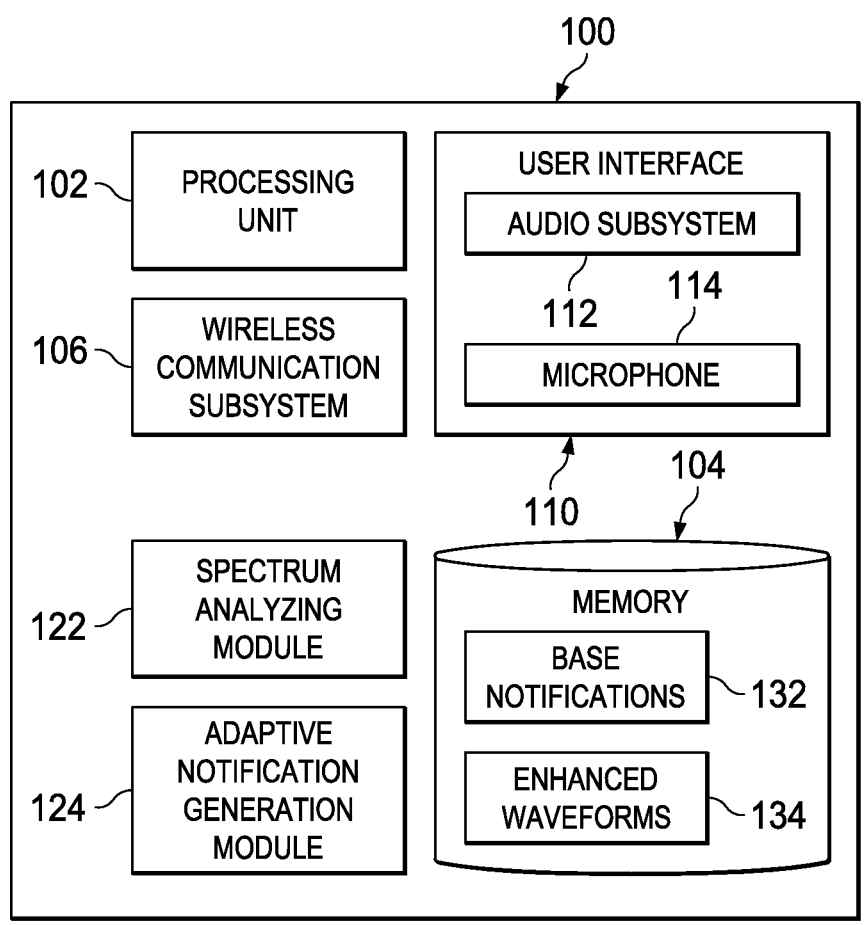
FIG. 1 is a block diagram illustrating an example user device that generates an adaptive notification according to an implementation.

FIG. 1 is a block diagram illustrating an example user device 100 that generates an adaptive notification according to an implementation. As illustrated, the example user device 100 includes a spectrum analyzing module 122 and an adaptive notification generation module 124. The example user device 100 also includes a processing unit 102, a wireless communication subsystem 106, a user interface 110, and a memory 104.

The user interface 110 represents one or more hardware modules, one or more software modules, or a combination thereof that can be configured to provide an input and output interface for the user device 100. The user interface 110 can include, for example, one or more of a screen or touch screen (for example, a liquid crystal display (LCD), a light emitting display (LED), an organic light emitting display (OLED), or a micro-electromechanical system (MEMS) display), a keyboard or keypad, a trackball, or a combination thereof As illustrated, the user interface 110 includes an audio system 112. The audio system 112 represents one or more hardware modules, one or more software modules, or a combination thereof that can be used to transmit the adaptive notification as an audio output. For example, the audio system 112 may include a speaker.

The user interface 110 also includes a microphone 114. The microphone 114 represents one or more hardware modules, one or more software modules, or a combination thereof that can be used to sense the environment and measure the environmental noise. In some cases, the microphone 114 may measure the environmental noise by periodically collecting audio inputs of the environment. In some cases, the microphone 114 may be a digital microphone. Alternatively or in combination, the microphone 114 may be an analog microphone. In some cases, the microphone 114 may be configured in an "always on" mode, where the microphone 114 can continuously measure the environmental noise. Alternatively or in combination, the microphone 114 can measure the environmental noise according to a measurement cycle. In some cases, the measurement cycle may be configured by the spectrum analyzing module 122 based on the movement of the user device. The following paragraphs provide additional details of the measurement cycle.

As illustrated, the user device 100 includes the spectrum analyzing module 122. The spectrum analyzing module 122 represents one or more hardware modules, one or more software modules, or a combination thereof that can be configured to receive the measurement from the microphone 114 and analyze the spectrum of the environmental noise.

In some cases, the spectrum analyzing module 122 may configure a measurement cycle for the microphone 114 to measure the environmental noise. For example, the spectrum analyzing module 122 may configure the rate and resolution of the audio data collection of the environment based on the measurement cycle. In some cases, measurement cycle may be configured based on the moving pattern of the user device 100. For example, the user device 100 may include a motion sensor unit used to detect the motion pattern of the user device 100. In some cases, the motion sensor unit may track the location of the user device 100 using, e.g., a Global Position System (GPS) module or an assisted-GPS module, and estimate the speed of the user device 100. The spectrum analyzing module 122 may configure the measurement cycle based on the estimated speed. For example, if the user device 100 is stationary or moves at a low speed, then the noise of the environment may change slowly. Therefore, the measurement cycle may include an increased delay between each measurement, a reduced resolution, or a combination thereof. If, on the other hand, the user device 100 moves at a high speed, then the noise of the environment may change quickly. Therefore, the measurement cycle may include a reduced delay between each measurement, an increased resolution, or a combination thereof In some cases, the spectrum analyzing module 122 may configure the measurement cycle based on the change of the environmental noise. For example, the spectrum analyzing module 122 may store the analyzed spectrum of the environmental noise based on the previous measurement. The spectrum analyzing module 122 may compare the analyzed spectrum of the environmental noise based on the current measurement with the stored spectrum based on the previous measurement to determine how fast the environmental noise changes. If the environmental noise changes fast over time, the spectrum analyzing module 122 may reduce the delay between each measurement, increase the resolution of the measurement, or a combination thereof. If, on the other hand, the environmental noise changes slowly over time, the spectrum analyzing module 122 may increase the delay between each measurement, reduce the resolution of the measurement, or a combination thereof.

Configuring the measurement cycle based on the movement and/or the changes of the environmental noise may provide one or more advantages. For example, when the environment changes slowly, the power consumption of the user device 100 used for measuring and processing environmental noise may be reduced without affecting the accuracy of the measurement.

Figure 2:
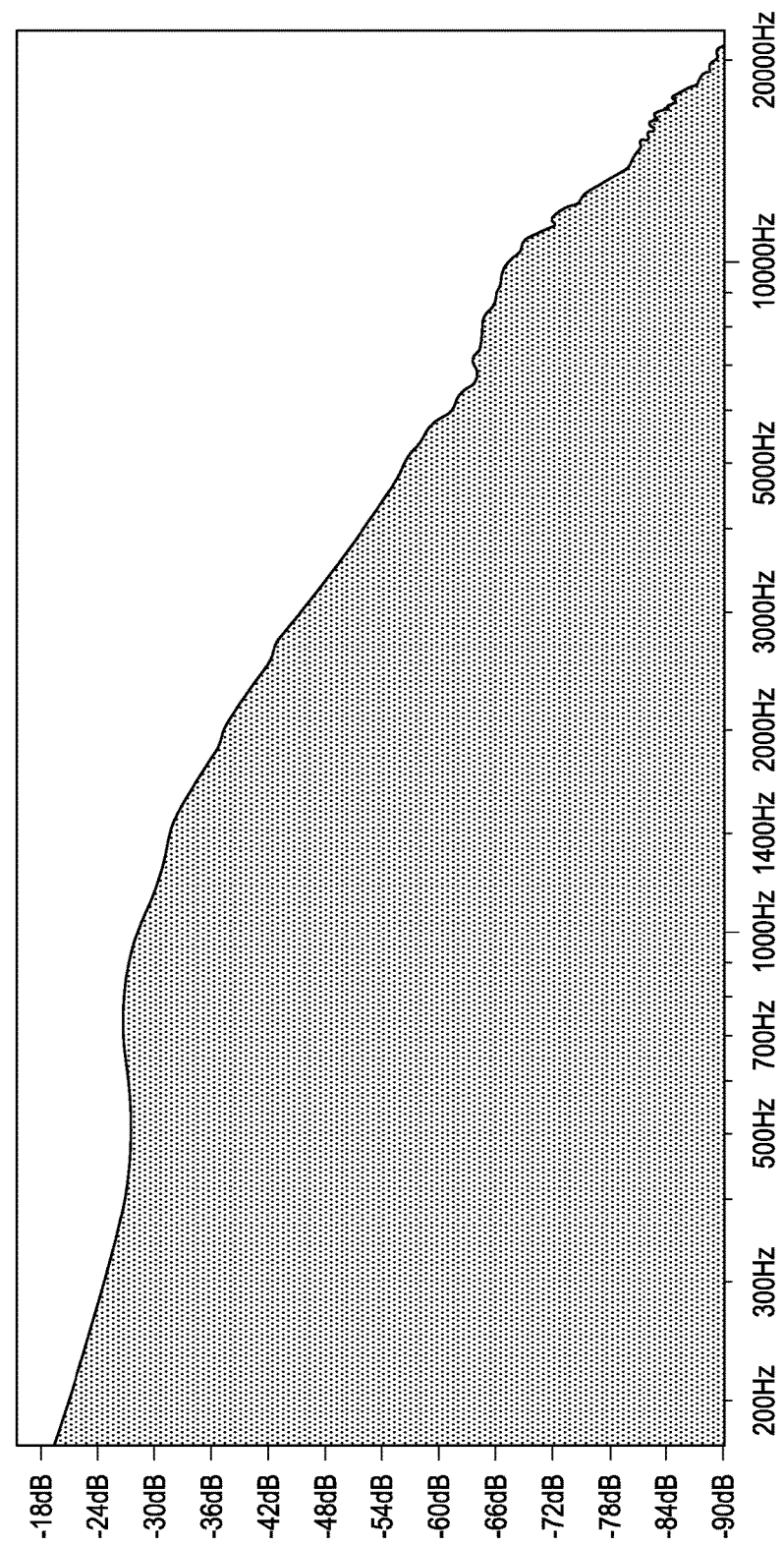
FIG. 2 is a chart illustrating an example spectrum analysis of the environmental noise.

The spectrum analyzing module 122 may receive the measurement data from the microphone 114 and perform a spectrum analysis of the environmental noise. FIG. 2 is a chart 200 illustrating an example spectrum analysis of the environmental noise. As shown in FIG. 2, the power distribution of the noise is uneven throughout the spectrum. In some bands, e.g., between 200 Hz and 1 KHz, the power level of the noise is high. In some bands, e.g., between 1 KHz and 10 KHz, the power level of the noise reduces as the frequency increases. In some bands, e.g., between 10 KHz and 20 KHz, the power level of the noise is low. In some cases, the spectrum analyzing module 122 may identify a portion of the spectrum that represents low power level of the noise. The identified portion may be used for adaptive notification enhancement. In some cases, the identification may be based on a predetermined power level. The spectrum analyzing module 122 may identify the portion of the spectrum where the power level of the noise is below the predetermined power level as a candidate portion of the spectrum for enhancement. For example, the predetermined power level may be −48 dB, and the identified portion may include frequency bands above 3.2 KHz.

In some cases, the spectrum analyzing module 122 may configure the measurement based on the power of the noise. For example, if the long term root mean square (RMS) of the noise power level is below a threshold, the spectrum analyzing module 122 may configure the measurement cycle to include an increased delay between the measurements to save power.

Referring back to FIG. 1, the user device 100 includes the adaptive notification generation module 124. The adaptive notification generation module 124 represents one or more hardware modules, one or more software modules, or a combination thereof that can be configured to generate an adaptive notification based on the spectrum analysis of the environmental noises.

Figure 3:
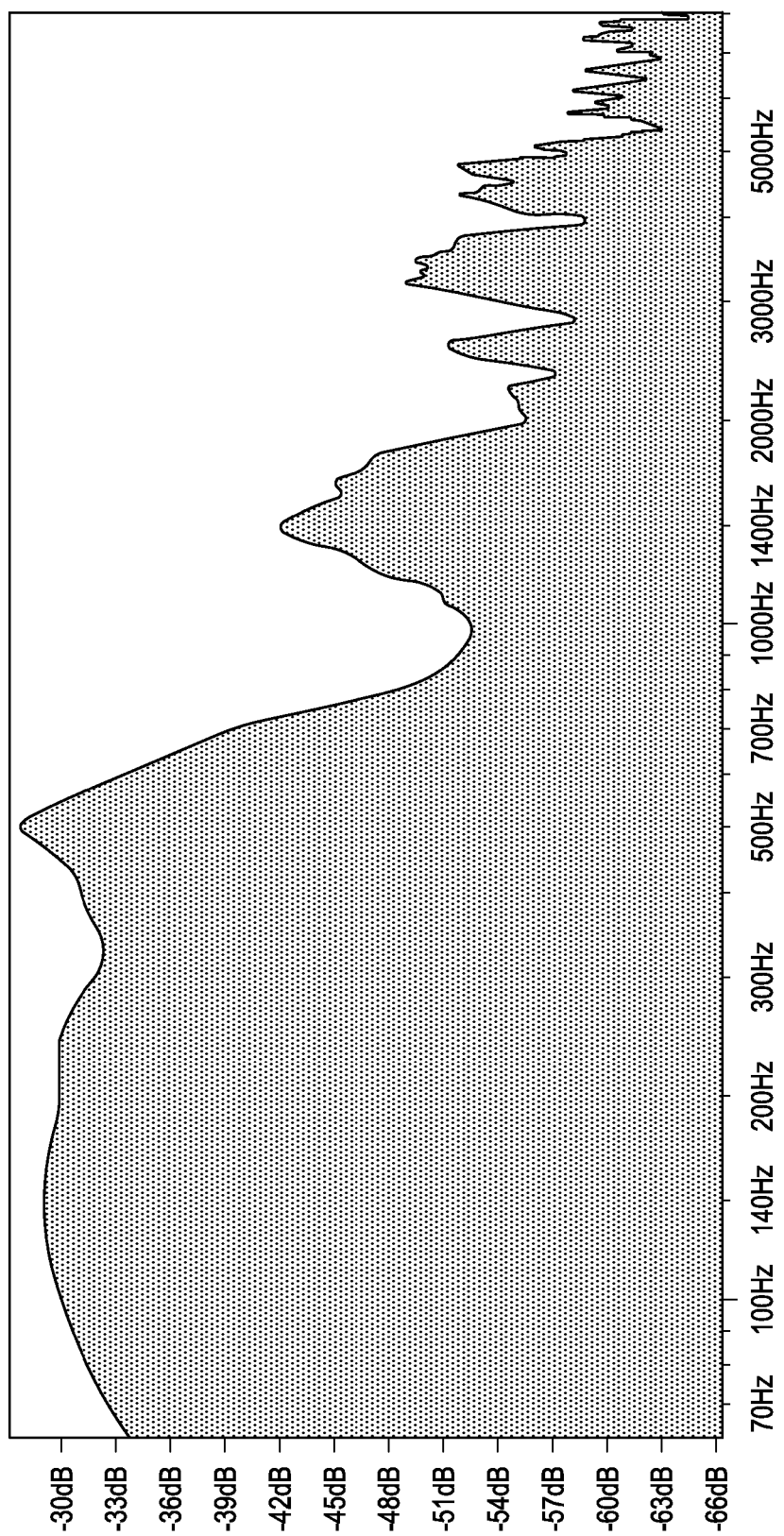
FIG. 3 is a chart illustrating an example spectrum analysis of a notification that collides with the environmental noise.
Figure 4:
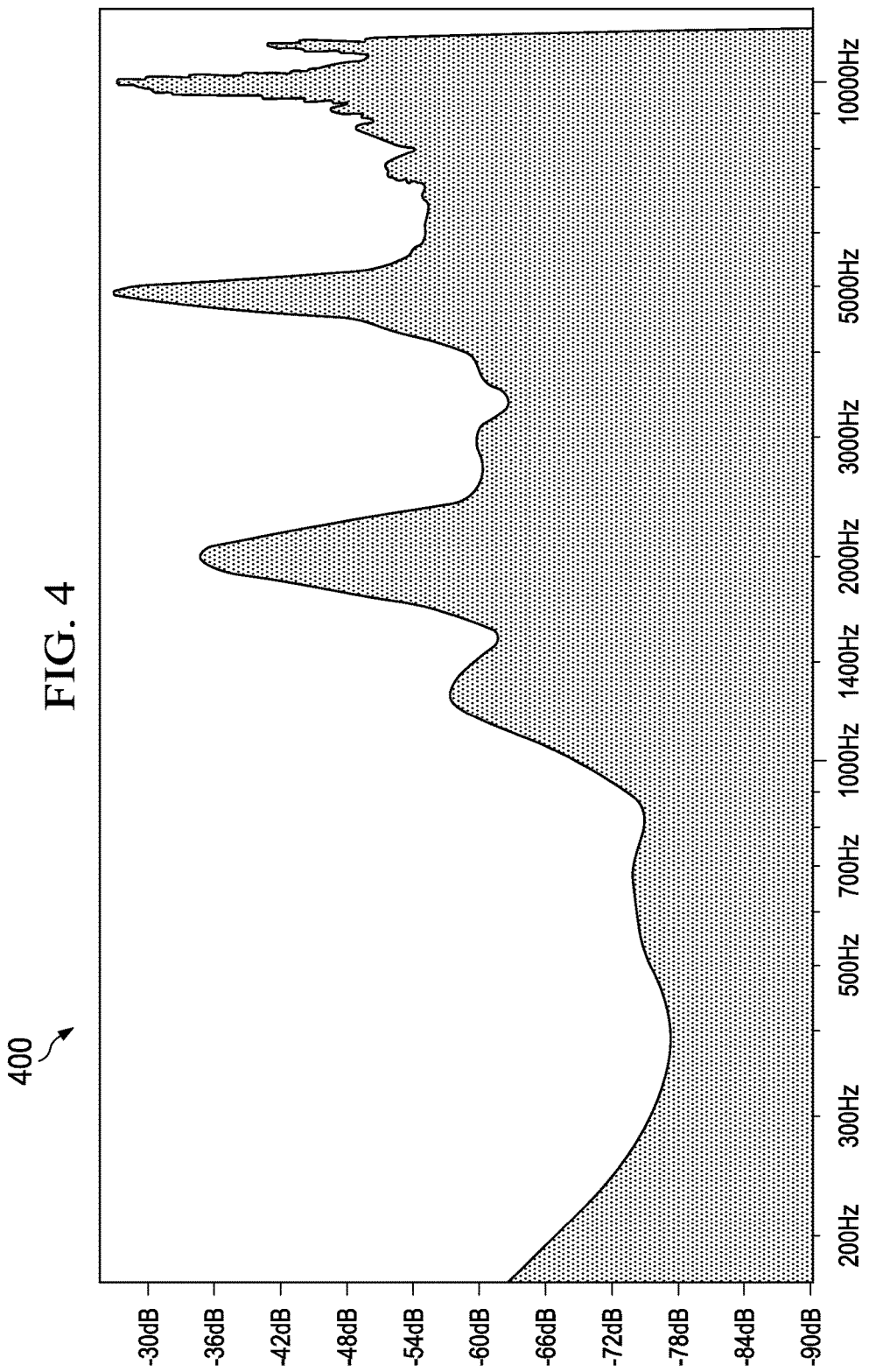
FIG. 4 is a chart illustrating an example spectrum analysis of a notification that does not collide with the environmental noise.

In some cases, the adaptive notification generation module 124 may generate an adaptive notification that has a high power level in the frequency bands where the noise power level is low. Therefore, the adaptive notification does not collide with the noise, and a user of the user device 100 may hear the notification more easily. FIG. 3 is a chart 300 illustrating an example spectrum analysis of a notification that collides with the environmental noise. As illustrated, the notification has a high power level below 1 KHz and low power level beyond 3 KHz, which is similar to the environmental noise illustrated in FIG. 2. Therefore, the high power portion of the notification may collide with the high power level of the noise and the user may not be able to discern the notification from the background noise. FIG. 4 is a chart 400 illustrating an example spectrum analysis of a notification that does not collide with the environmental noise. As illustrated, the notification has a high power level in frequency bands around 2 KHz, 5 KHz, and 10 KHz, which is different than the environmental noise illustrated in FIG. 2. Therefore, the high power portion of the notification does not collide with the high power level of the noise and the user may be able to detect the notification over the background noise.

Referring back to FIG. 1, in some cases, the adaptive notification generation module 124 may select a base notification and generate the adaptive notification by enhancing the frequency bands of the base notification corresponding to low noise power. For example, the adaptive notification generation module 124 may select an enhanced waveform. The adaptive notification generation module 124 may add the enhanced waveform to the base notification to generate the adaptive notification. In some cases, the adaptive notification generation module 124 may select an enhanced waveform that has a high power level in the frequency bands corresponding to the low power level of the noise. Alternatively or in combination, the adaptive notification generation module 124 may add the enhanced waveform to the frequency bands of the base notification that corresponds to the low power level of the noise.

In some cases, the adaptive notification generation module 124 may select the waveforms based on context of the notification. In one example, the context may be a source context. Examples of source contexts may be email, text, voicemail, application, or any other context that is associated with the source of the notification. Each source context may correspond to a different waveform. Therefore, the adaptive notification generation module 124 may determine the source of the notification, and select the waveform that corresponds to the source context of the notification. By including the waveform that corresponds to the source context of the notification, the user may know the source of the notification, e.g., whether the notification is an email, a text, a voicemail, an application, from the audio output of the notification. In some cases, the source context may include a source address of the adaptive notification. The source address may be an email address, a phone number, or any other addresses that identifies the address associated with the notification. Therefore, the audio output of the adaptive notification may indicate the caller of the voice call or the sending of the email that triggers the notification. In some cases, the associations between different waveforms and the respective source contexts may be configurable by a user of the user device 100.

In another example, the context may be an event context. Examples of event contexts may be a calendar event, a task, or a deadline that triggers the notification. Each event context may correspond to a different waveform. Therefore, the adaptive notification generation module 124 may determine the event that triggers the notification and select the waveform that corresponds to the event context of the notification. In some cases, a user may configure different waveforms for different event occurrences. For example, a waveform may be associated with an external meeting with a client, and a different waveform may be associated with an internal meeting. Therefore, the audio output of the adaptive notification may indicate the event that triggers the notification. In some cases, the associations between different waveforms and the respective event contexts may be configurable by a user of the user device 100.

In yet another example, the context may be an urgency context. The urgency context may indicate the time urgency of the notification, the importance of the notification, or a combination thereof. For example, the urgency context may indicate that the notification is for a meeting that would occur in 30 minutes, 15 minutes, or 5 minutes. The urgency context may also indicate that the notification has a high, medium, or low importance. Different waveforms may be associated with different urgency context. The adaptive notification generation module 124 may determine the urgency of the notification and select the waveform that corresponds to the urgency context of the notification. For example, a waveform with increased volume or pitch may be selected for a more urgent notification. Therefore, the audio output of the adaptive notification may indicate the urgency of the notification. In some cases, the associations between different waveforms and the respective urgency contexts may be configurable by a user of the user device 100.

In some cases, the adaptive notification generation module 124 may use one or more sonic layers to generate the adaptive notification. For example, the enhanced waveforms may be stored in a wavetable that includes a plurality of sonic layers. Each sonic layer may be associated with a respective type of context. For example, the wavetable may include 3 sonic layers. The first layer is associated with the source context. The second layer is associated with the event context. The third layer is associated with the urgency context. The sonic layers may be orthogonal to one another. Therefore, waveforms from multiple sonic layers may be added together to indicate multiple contexts associated with the notification.

For example, the adaptive notification generation module 124 may select a first waveform that corresponds with the source context of the notification from the first sonic layer, a second waveform that corresponds with the event context of the notification from the second sonic layer, and a third waveform that corresponds with the urgency context of the notification from the third sonic layer. The adaptive notification generation module 124 may add the first, the second, and the third waveform to generate the enhanced waveform. The adaptive notification generation module 124 may add the enhanced waveform to the base notification to generate the adaptive notification.

In some cases, the adaptive notification generation module 124 may use DSP (Digital Signal Processing) techniques to generate the adaptive notification. In some cases, the DSP algorithms can be used to generate optimum audio synthetic layers from an original source audio by creating artificial layers via re-sampling. For example, the adaptive notification generation module 124 may use DSP algorithms to generate the adaptive notification by positioning the high power level component of the base notification in the frequency bands that correspond to low noise power of the environment.

Alternatively or in combination, the adaptive notification generation module 124 may distort the waveform of the base notification based on context associated with the notification. For example, the adaptive notification generation module 124 may use DSP algorithms to increase the pitch or the volume of selected frequency bands based on the source context, the event context, the urgency context, or any other contexts. In one example, the adaptive notification generation module 124 may increase the pitch for a notification with high urgency and decrease the pitch for a notification with low urgency. In some cases, the association between different DSP distortion techniques and the respective contexts may be configurable by a user.

As illustrated, the user device 100 includes the memory 104. The memory 104 represents one or more hardware modules, one or more software modules, or a combination thereof that may be configured to store computer-readable information. Examples of the memory 104 may include Random-access memory (RAM), Read-only memory (ROM), or flash memory. The memory 104 can store an operating system (OS) of the user device 100, and various other computer-executable instructions, logic or software programs for performing one or more of the processes, steps, or actions described above.

As illustrated, the memory 104 can store base notifications 132 and enhanced waveforms 134. As discussed previously, the adaptive notification generation module 124 may select one of the base notifications 132 and enhance the selected base notification according to the spectrum analysis of the environmental noise, the context of the notification, and a combination thereof In some cases, the adaptive notification generation module 124 may select one or more enhanced waveforms 134 to generate the adaptive notification. In some cases, the enhanced waveforms 134 may be associated with one or more sonic layers.

In some cases, the memory 104 may also store the spectrum analysis of the environmental noise. As discussed previously, the spectrum analyzing module 122 may compare the spectrum analysis from different measurements to configure the measurement cycle.

As illustrated, the user device 100 includes the processing unit 102. The processing unit 102 can include one or more processing components (alternatively referred to as "processors" or "central processing units" (CPUs)) configured to execute instructions related to one or more of the processes, steps, or actions described herein in connection with one or more of the implementations disclosed herein. In some implementations, the processing unit 102 may be configured to generate control information, such as a measurement report, or respond to received information, such as control information from a network node. The processing unit 102 may also be configured to make a Radio Resource Management (RRM) decision such as cell selection/reselection information or trigger a measurement report.

As illustrated, the user device 100 includes the wireless communication subsystem 106. The wireless communication subsystem 106 may be configured to provide wireless communication for voice, data, and/or control information provided by the processing unit 102. The wireless communication subsystem 106 can include, for example, one or more antennas, a receiver, a transmitter, a local oscillator, a mixer, and a digital signal processing (DSP) unit. In some implementations, the subsystem 106 can support multiple-input multiple-output (MIMO) transmissions. In some implementations, the receiver in the wireless communication subsystems 106 can be an advance receiver or a baseline receiver. Two receivers can be implemented with identical, similar, or different receiver processing algorithms. In some cases, the wireless communication subsystem 106 can be configured to transmit and receive data using Global System for Mobile communication (GSM), Interim Standard 95 (IS-95), Universal Mobile Telecommunications System (UMTS), CDMA2000 (Code Division Multiple Access), Evolved Universal Mobile Telecommunications System (E-UMTS), Long Term Evaluation (LTE), LTE-Advanced, or any other radio access technology.

Turning to a general description of the elements, a user device may be referred to as mobile electronic device, user device, mobile station, subscriber station, portable electronic device, mobile communications device, wireless modem, or wireless terminal. Examples of a user device (e.g., the user device 100) may include a cellular phone, personal data assistant (PDA), smart phone, laptop, tablet personal computer (PC), pager, portable computer, portable gaming device, wearable electronic device, or other mobile communications device having components for communicating voice or data via a wireless communication network. The wireless communication network may include a wireless link over at least one of a licensed spectrum and an unlicensed spectrum.

Other examples of a user device include mobile and fixed electronic device. A user device may include a Mobile Equipment (ME) device and a removable memory module, such as a Universal Integrated Circuit Card (UICC) that includes a Subscriber Identity Module (SIM) application, a Universal Subscriber Identity Module (USIM) application, or a Removable User Identity Module (R-UIM) application. The term "user device" can also refer to any hardware or software component that can terminate a communication session for a user. In addition, the terms "user equipment," "UE," "user equipment device," "user agent," "UA," "user device," and "mobile device" can be used synonymously herein.

While elements of FIG. 1 are shown as including various component parts, portions, or modules that implement the various features and functionalities, nevertheless these elements may instead include a number of sub-modules, third-party services, components, libraries, and such, as appropriate. Furthermore, the features and functionality of various components can be combined into fewer components as appropriate.

Figure 5:
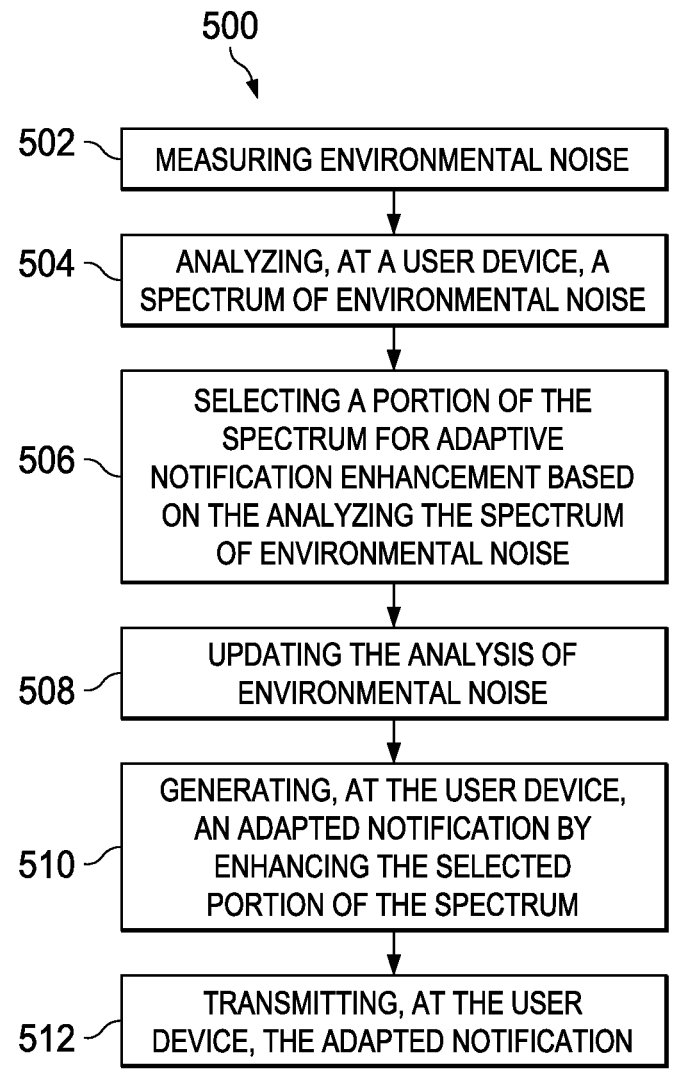
FIG. 5 is a flowchart illustrating an example method for generating an adaptive notification by a user device.

FIG. 5 is a flowchart illustrating an example method 500 for generating an adaptive notification by a user device. The method 500 may begin at block 502, where environmental noise is measured. In some cases, the environmental noise may be measured by a microphone. At block 504, the spectrum of the measured environmental noise is analyzed. At block 506, the spectrum of the measured environmental noise is classified. In some cases, a portion of the spectrum of the measured environmental noise that have low power may be identified. In some cases, the user device may store the spectrum analysis of the environmental noise.

At block 508, the analysis of the environmental noise may be updated. In some cases, the microphone may be turned into an "always-on" mode to measure the environmental noise continuously. In some cases, the environmental noise may be measured according to a measurement cycle. For example, the user device may detect a motion pattern of the user device and determine the measurement cycle based on the detected motion pattern. In some cases, the user device may update the environmental noise after each measurement. For example, after a measurement, the user device may compare the spectrum analysis based on the current measurement with the analysis based on the pervious measurement. If the low power portion of the spectrum has changed, the user device may update the stored spectrum analysis.

At block 510, an adapted notification is generated. In some cases, the adapted notification is generated based on the spectrum analysis of the environmental noise. For example, the user device may select a base notification. The user device may select an enhanced waveform and add the selected enhanced waveform to the base notification to generate the adapted notification. The selected enhanced waveform may be added on the portion of the spectrum that is identified as having low environmental noise.

In some cases, the enhanced waveform may be selected from a plurality of predetermined waveforms. In some cases, the selection of the enhanced waveform is based on a context of the notification. In some cases, the plurality of the predetermined waveforms may be organized in one or more sonic layers, each sonic layer corresponding to a category of context. Examples of the category may include a source context, an urgency context, and an event context. In some cases, the user device may select a first waveform from a first sonic layer based on the source context of the notification, a second waveform from a second sonic layer based on the event context of the notification, and a third waveform from a third sonic layer based on the urgency context of the notification.

At block 512, the user device transmits the adapted notification.

While operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be employed. Moreover, the separation of various system components in the implementation described above should not be understood as requiring such separation in all implementations, and it should be understood that the described program components and systems can generally be integrated together in a signal software product or packaged into multiple software products.

Also, techniques, systems, subsystems, and methods described and illustrated in the various implementations as discrete or separate may be combined or integrated with other systems, modules, techniques, or methods. Other items shown or discussed as coupled or directly coupled or communicating with each other may be indirectly coupled or communicating through some interface, device, or intermediate component, whether electrically, mechanically, or otherwise. Other examples of changes, substitutions, and alterations are ascertainable by one skilled in the art and could be made.

While the above detailed description has shown, described, and pointed out the fundamental novel features of the disclosure as applied to various implementations, it will be understood that various omissions, substitutions, and changes in the form and details of the system illustrated may be made by those skilled in the art. In addition, the order of method steps are not implied by the order they appear in the claims.

What is claimed is:

1. A method, comprising:
    analyzing, at a user device, a spectrum of environmental noise;
    selecting, based on analyzing the spectrum of environmental noise, a portion of the spectrum for adaptive notification enhancement, wherein a power level of the environmental noise in the selected portion of the spectrum is less than a predetermined power level;
    after selecting the portion of the spectrum for adaptive notification enhancement, generating, at the user device, an adapted notification, wherein the adapted notification is generated by enhancing a portion of a notification corresponding to the selected portion of the spectrum; and
    transmitting, at the user device, the adapted notification.

2. The method of claim 1, wherein generating the adapted notification comprises:
    selecting an enhanced waveform from a plurality of predetermined waveforms; and
    adding the selected enhanced waveform to a notification waveform to generate the adapted notification.

3. The method of claim 2, wherein the enhanced waveform is selected based on a context of the notification.

4. The method of claim 3, wherein the context is at least one of a source context or an urgency context.

5. The method of claim 2, wherein each of the plurality of predetermined waveforms is associated with at least one of a plurality of sonic layers, and each of the plurality of sonic layers is associated with a context.

6. The method of claim 1, wherein analyzing the spectrum of environmental noise comprises measuring a frequency distribution of environmental noise using a digital microphone.

7. The method of claim 6, further comprising:
    detecting a motion pattern of the user device;
    determining a measurement cycle based on the detected motion pattern; and
    measuring the frequency distribution according to the measurement cycle.

8. A tangible, non-transitory machine-readable medium encoded with machine-executable instructions, wherein execution of the machine-executable instructions causes a computing device to perform operations comprising:
    analyzing a spectrum of environmental noise;
    selecting, based on analyzing the spectrum of environmental noise, a portion of the spectrum for adaptive notification enhancement, wherein a power level of the environmental noise in the selected portion of the spectrum is less than a predetermined power level;
    after selecting the portion of the spectrum for adaptive notification enhancement, generating an adapted notification, wherein the adapted notification is generated by enhancing a portion of a notification corresponding to the selected portion of the spectrum; and
    transmitting the adapted notification.

9. The tangible, non-transitory machine-readable medium of claim 8, wherein generating the adapted notification comprises:
    selecting an enhanced waveform from a plurality of predetermined waveforms; and
    adding the selected enhanced waveform to a notification waveform to generate the adapted notification.

10. The tangible, non-transitory machine-readable medium of claim 9, wherein the enhanced waveform is selected based on a context of the notification.

11. The tangible, non-transitory machine-readable medium of claim 10, wherein the context is at least one of a source context or an urgency context.

12. The tangible, non-transitory machine-readable medium of claim 8, wherein analyzing the spectrum of environmental noise comprises measuring a frequency distribution of environmental noise using a digital microphone.

13. The tangible, non-transitory machine-readable medium of claim 12, wherein the operations further comprise:
    detecting a motion pattern of the computing device;
    determining a measurement cycle based on the detected motion pattern; and
    measuring the frequency distribution according to the measurement cycle.

14. A device, comprising:
    a memory; and
    at least one hardware processor communicatively coupled with the memory and configured to:
        analyze, at the device, a spectrum of environmental noise;
        select, based on analyzing the spectrum of environmental noise, a portion of the spectrum for adaptive notification enhancement, wherein a power level of the environmental noise in the selected portion of the spectrum is less than a predetermined power level;
        after selecting the portion of the spectrum for adaptive notification enhancement, generate, at the device, an adapted notification, wherein the adapted notification is generated by enhancing a portion of a notification corresponding to the selected portion of the spectrum; and
        transmit, at the device, the adapted notification.

15. The device of claim 14, wherein generating the adapted notification comprises:
    selecting an enhanced waveform from a plurality of predetermined waveforms; and
    adding the selected enhanced waveform to a notification waveform to generate the adapted notification.

16. The device of claim 15, wherein the enhanced waveform is selected based on a context of the notification.

17. The device of claim 16, wherein the context is at least one of a source context or an urgency context.

18. The device of claim 15, wherein each of the plurality of predetermined waveforms is associated with at least one of a plurality of sonic layers, and each of the plurality of sonic layers is associated with a context.

19. The device of claim 14, further comprising a digital microphone, and wherein analyzing the spectrum of environmental noise comprises measuring a frequency distribution of environmental noise using the digital microphone.

20. The device of claim 19, further comprising a motion sensor that is configured to detect a motion pattern of the device, and wherein the at least one hardware processor is further configured to:
    determine a measurement cycle based on the detected motion pattern; and
    measure the frequency distribution according to the measurement cycle.

* * * * *